United States Patent
Dellapi et al.

[11] Patent Number: 6,142,595
[45] Date of Patent: Nov. 7, 2000

[54] CONTAINER HAVING A SELF-ALIGNING AND SEALABLE CLOSURE

[75] Inventors: Monty Richard Dellapi, New Foundland; Alexander Petrunia, Madison; Daniel Plaza, Mendham, all of N.J.

[73] Assignee: Lucent Technologies, Inc., Murray Hill, N.J.

[21] Appl. No.: 09/250,076

[22] Filed: Feb. 12, 1999

[51] Int. Cl.[7] ................................................. A47B 96/00
[52] U.S. Cl. ............................................ 312/326; 312/296
[58] Field of Search .................................... 312/326, 329, 312/223.1, 245, 248, 283, 296; 361/728, 730; 292/DIG. 11; 411/401, 402, 410, 919; 49/501; 455/347, 348

[56] References Cited

U.S. PATENT DOCUMENTS

| | | | |
|---|---|---|---|
| 1,131,886 | 3/1915 | Wisterman | 292/DIG. 11 |
| 2,642,331 | 6/1953 | Sprinlkle | 312/283 |
| 4,085,650 | 4/1978 | Flynn | 411/403 |
| 4,799,289 | 1/1989 | Grass . | |
| 4,869,023 | 9/1989 | Bakula et al. . | |
| 5,219,443 | 6/1993 | Stoerk et al. . | |
| 5,267,762 | 12/1993 | Gromotka . | |
| 5,435,641 | 7/1995 | Dumon Dupuis et al. | 312/223.1 |
| 5,641,086 | 6/1997 | Sonntag et al. . | |
| 5,826,957 | 10/1998 | DeBartolo, Jr. et al. | 312/326 |
| 5,894,407 | 4/1999 | Aakalu et al. | 361/695 |

FOREIGN PATENT DOCUMENTS

444409   2/1968   Switzerland ........................... 312/245

*Primary Examiner*—Janet M. Wilkens
*Attorney, Agent, or Firm*—Schnader, Harrison, Segal & Lewis

[57] ABSTRACT

A sealable container having a container body, a cover forming a right angle movably connected to the container body, at least one alignment piece and corresponding alignment bracket, and at least one tension lock connected to the container body. When the container is closed, a conical alignment pin on the alignment bracket engages the conical hole and the tension lock engages the cover in a single action to provide alignment and sealing force to compress and seal enclosures between the cover and the container body simultaneously in two perpendicular planes.

18 Claims, 7 Drawing Sheets

CONTAINER HAVING A SELF-ALIGNING AND SEALABLE CLOSURE

BACKGROUND OF THE INVENTION

1. Field of the Invention

The present invention relates to a sealable container for electronic and/or pneumatic devices, and more particularly, to a scalable container having a mechanism for single action closing of a door of the container.

2. Description of the Prior Art

In the wireless telephone industry, most wireless base stations have single face doors connected to a container with five sides enclosing electronics, and space in the base station is a premium. A wireless base station processes wireless phone calls and is used in industrial buildings, on telephone poles, and in public places. In these stations, seals for weatherproofing are required by UL, and electromagnetic seals are required by the FCC. A proper seal is difficult to achieve because of the need to achieve gasket compression forces of a minimum of 15 pounds, as well as friction forces. As a result, strong closing forces are necessary for a proper seal.

A typical container assembly can be found in Grass, U.S. Pat. No. 4,799,289. In Grass, a hinge frame has a hinge cup firmly attached to an inside of a door part of a furniture piece and can be quickly connected to the inside of the furniture by a cover bracket, which is mounted on the hinge cup. A pivot connection attached near the door and spring-loaded detent engagement away from the door enables the quick-release function. Grass does not provide a seal between the door and the furniture piece.

An enclosure for electronics and pneumatic devices is disclosed in Sonntag et al., U.S. Pat. No. 5,641,086, which has a box, a single face cover mounted on the box, fasteners on the box wall and hinge pins mounted to the fasteners by hinge means. The pins prevent the hinge means from moving upwards when they are in place and the cover is locked. Sonntag does not disclose seals between the cover and the box.

SUMMARY OF THE INVENTION

The present invention is directed to a container having a mechanism to compress, align, and seal a cover to the container simultaneously in two perpendicular directions in a single action, where the container is designed to minimize size and space. The single action closing overcomes the forces on the cover in two perpendicular directions. The mechanism includes a combination of a latch, alignment pin, and alignment plate. This provides single action closing of an L-shaped door, or right angle door, for a tight water intrusion and EMI seal.

The use of a right angle door provides minimization of the size of the base station, or container, with full use of the space inside the container for very dense packaging of electronics. An L-shaped door provides more open area than a single-faced door when the door is in an open position. This allows for easy assembly of the electronics during manufacture and easy repair and replacement of the electronics by providing space in the door to mount hardware that would otherwise be mounted in the container. The right angle door also minimizes cable bend radii and routing between the electronics. The L-shaped door is further described in U.S. patent application Ser. No. 09/196,242 entitled "Adjustable Mounting Bracket" and U.S. patent application Ser. No. 09/196,241 entitled "Fastener with Alignment and Spacing Features."

The present invention includes a container body formed from a top, bottom, side wall and back wall. A cover movably connects to the back wall and sealingly communicates with at least a portion of the top, bottom, back and side wall of the container. The cover is formed into two panels substantially forming a right angle. One panel must be connected to the container at the back wall and contact the top and bottom of the container. The other cover panel must contact the top, bottom, and side wall of the container.

At least one alignment piece, arranged substantially parallel to the panel that contacts the side wall and is perpendicular to the panel connected to the cover, is connected to the cover. At least one corresponding alignment bracket, arranged substantially parallel to the back wall and substantially perpendicular to the top, is connected to the container body. A substantially conical alignment pin extending from the alignment bracket engages a substantially conical hole in the alignment piece when the container is closed or substantially closed. The conical hole provides a guide to the alignment pin because of the right angle offset resulting from the movable connection of the cover to the back wall. The conical hole and conical alignment pin coact to align the cover with the container body. When the alignment bracket and alignment pin are engaged and parallel to one another, there is a nominal gap, or space, between the plate and pin for a gasket or seal. The coaction of the conical alignment pin and conical hole serves to sealingly engage the cover with the container body.

At least one tension lock is connected to the container body to engage the cover and apply sealing force between an edge portion of the cover and edge portions of the container body. The tension lock may be a plurality of under center draw latches.

The container may also have side shields, a shield mounting bracket on the cover to mount a shield, and a plurality of substantially parallel cooling fins.

DETAILED DESCRIPTION

The present invention will be understood more fully from the detailed description given below and from accompanying drawings of preferred embodiments of the invention, which, however, should not be taken to limit the invention to a specific embodiment, but are for explanation and understanding only.

Figure 1:
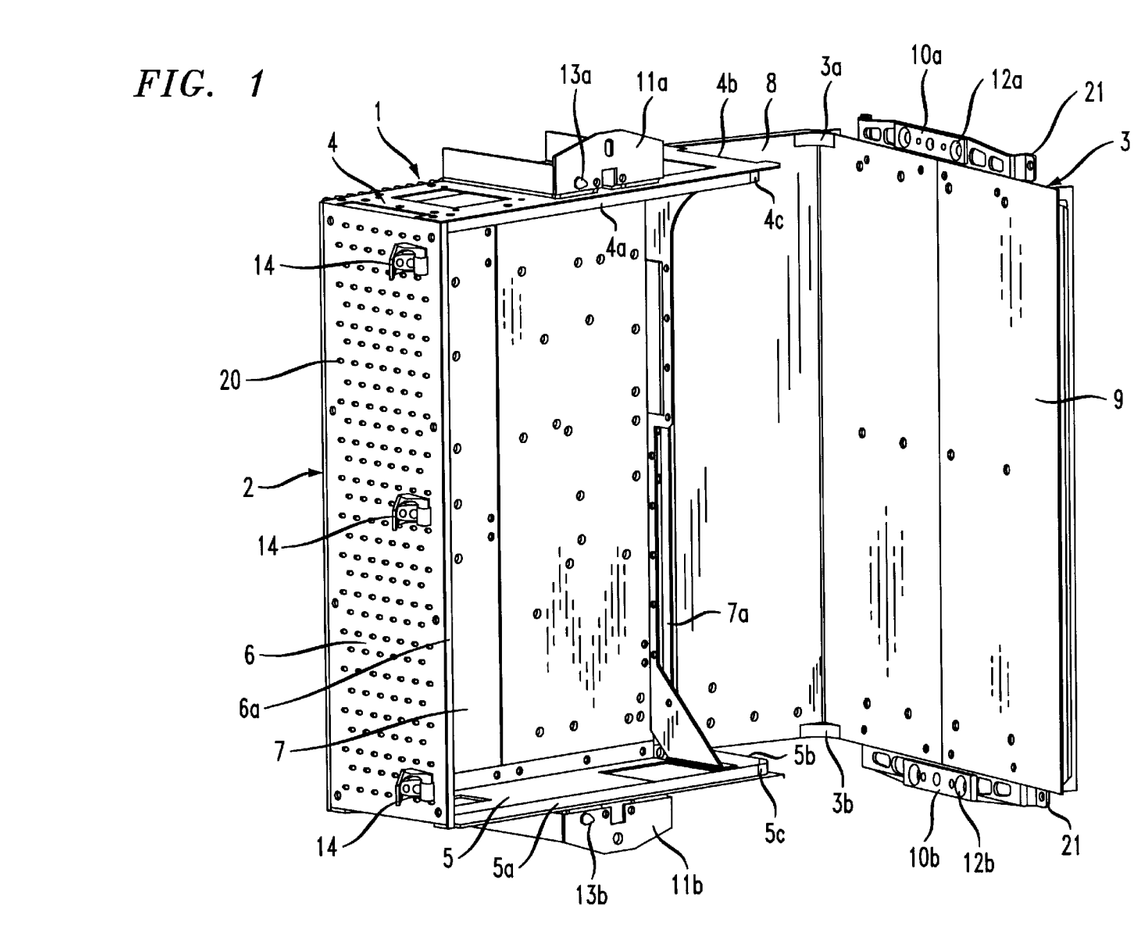
FIG. 1 is a perspective view of the front and side of a container of the invention with its cover in an open position.

FIG. 1 illustrates one embodiment of the container of the invention with its door in an open position. The container 1 has a container body or cabinet 2, to hold electronics and other designated equipment and a cover 3 or door. The cabinet 2 has a top 4, a bottom 5, a side wall 6, and a back wall 7. The top 4 contains surfaces 4a, 4b (not visible), and 4c. Surface 4a is perpendicular to surface 4b, forming a right angle, and surfaces 4a and 4b are tangentially and continuously connected with curved surface 4c. Surface 4c is formed with a substantial radius. The bottom 5 contains surface 5a, 5b (not visible), and 5c. Surface 5a is perpendicular to surface 5b, forming a right angle, and surfaces 5a and 5b are tangentially and continuously connected with curved surface 5c. Surface 5c is formed with a substantial radius. Surfaces 4c and 5c have substantially the same radius. Side wall 6 has a surface 6a that is connected to surface 4a at the top and 5a at the bottom. Back wall 7 has a surface 7a that is connected to 4b at the top and 5b at the bottom. The collective of surfaces 4a, 5a, and 6a is perpendicular to the collective of surfaces 4b, 5b, and 7a, forming a right angle, and the collectives are tangentially connected with curved surfaces 4c and 5c. The collective of 4a, 4b, 4c, 5a, 5b, 5c, 6a, and 7a form a continuous surface. The cover 3 is movably connected to back wall 7 and capable of communicating with, or contacting, at least a portion of top 4, bottom 5, side wall 6 and rear wall 7 on surfaces 4a, 4b, 4c, 5a, 5b, 5c, 6a and 7a. The cover 3 is formed into two panels 8 and 9 substantially forming a right angle, or L-shape, with curved surfaces 3a and 3b. Surfaces 3a and 3b are formed with substantial radii and are tangentially connected to panels 8 and 9. The cover 3 with panels 8 and 9 form the second side and front of the container 1 when cover 3 is in the closed position. The cover 3 with panels 8 and 9 and surfaces 3a and 3b may be formed from one part (such as a casting or from sheet metal), from multiple parts, or by any method known or used in the art.

At least one alignment piece, preferably alignment plates 10a and 10b, connects to an edge portion of cover 3. Alignment plates 10a and 10b are arranged substantially parallel to panel 9 and perpendicular to panel 8. At least one corresponding alignment bracket 11a and 11b is connected to cabinet 2. Alignment brackets 11a and 11b are arranged substantially parallel to back wall 7 and substantially perpendicular to top 4. In a preferred embodiment, first plate 10a is located on the top edge portion of cover 3 and second plate 10b is located on a bottom edge portion of cover 3. Preferably, bracket 11a is mounted on a top portion of cabinet 2, preferably at an edge portion of top 4, and bracket 11b is mounted on a bottom portion of cabinet 2, preferably at an edge portion of bottom 5.

Brackets 11a and 11b each have a substantially conical alignment pin, 13a and 13b, respectively, capable of engaging substantially conical holes 12a and 12b within alignment plates 10a and 10b. In the preferred embodiment, alignment pin 13b engages conical hole 12a and alignment pin 13b engages conical hole 12b. Alignment pins 13a and 13b are arranged substantially parallel to side wall 6 and substantially perpendicular to alignment brackets 11a and 11b and back wall 7. Conical holes 12a and 12b and alignments pins 13a and 13b have substantially conical portions and tapered portions. The tapered portions of alignment pins 13a and 13b, or tapered distal top portions, are smaller than the conical portions of pins 13a and 13b, and the corresponding tapered portions of the conical holes 12a and 12b are larger than the conical portions of holes 12a and 12b. When the cover 3 is closed, the tapered portions of conical holes 12a and 12b engage with the tapered distal tip portions of alignment pins 13a and 13b. Conical holes 12a and 12b provide a guide to alignment pins 13a and 13b, which is necessary because of the right angle offset resulting from the movable connection arrangement of the cover 3 to the back wall 7. The cover 3 is aligned when the conical portions of conical holes 12a and 12b contact the conical portions of alignment pins 13a and 13b.

At least one tension lock 14 is connected to side wall 6 of cabinet 2 and adapted to engage cover 3 and apply a sealing force between the edge portions of 8 and 9, 3a, and 3b and surfaces 4a, 4b, 4c, 5a, 5b, 5c, 6a, and 7a of cabinet 2. Preferably, the tension lock 14 is an under center draw latch, which is known in the art, where the pivot of the lever and the catch is positioned above the center line of the base and the keeper when fastened. Three latches are shown in FIG. 1, but any number or types of latches performing the same or similar function may be used. In a preferred embodiment, some or all of the component parts of cabinet 2 also have side shields with vent holes 20. Shield mounting bracket 21 on cover 3 may be used to mount a shield (not shown) on cover 3.

Figure 2:
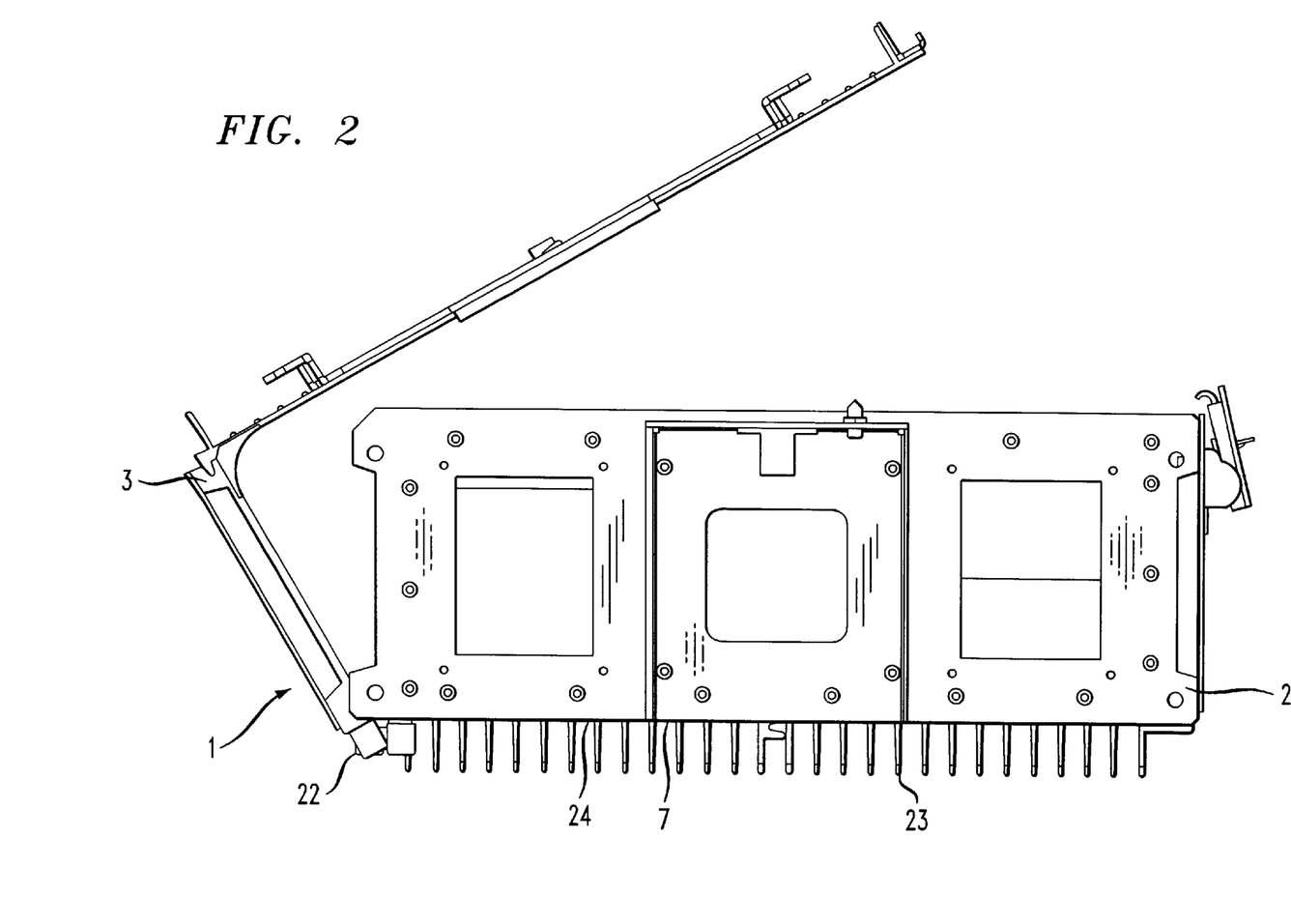
FIG. 2 is a top plan view of the container shown in FIG. 1.

A top view of container 1 is displayed in FIG. 2. In a preferred embodiment, the cover 3 is connected to back wall 7 of cabinet 2 by a hinge 22. The cover 3 may also be connected to back wall 7 of cabinet 2 by a plurality of hinges. The back wall 7 also has a plurality of substantially parallel cooling fins 23 engaging the outer surface 24.

Figure 4:
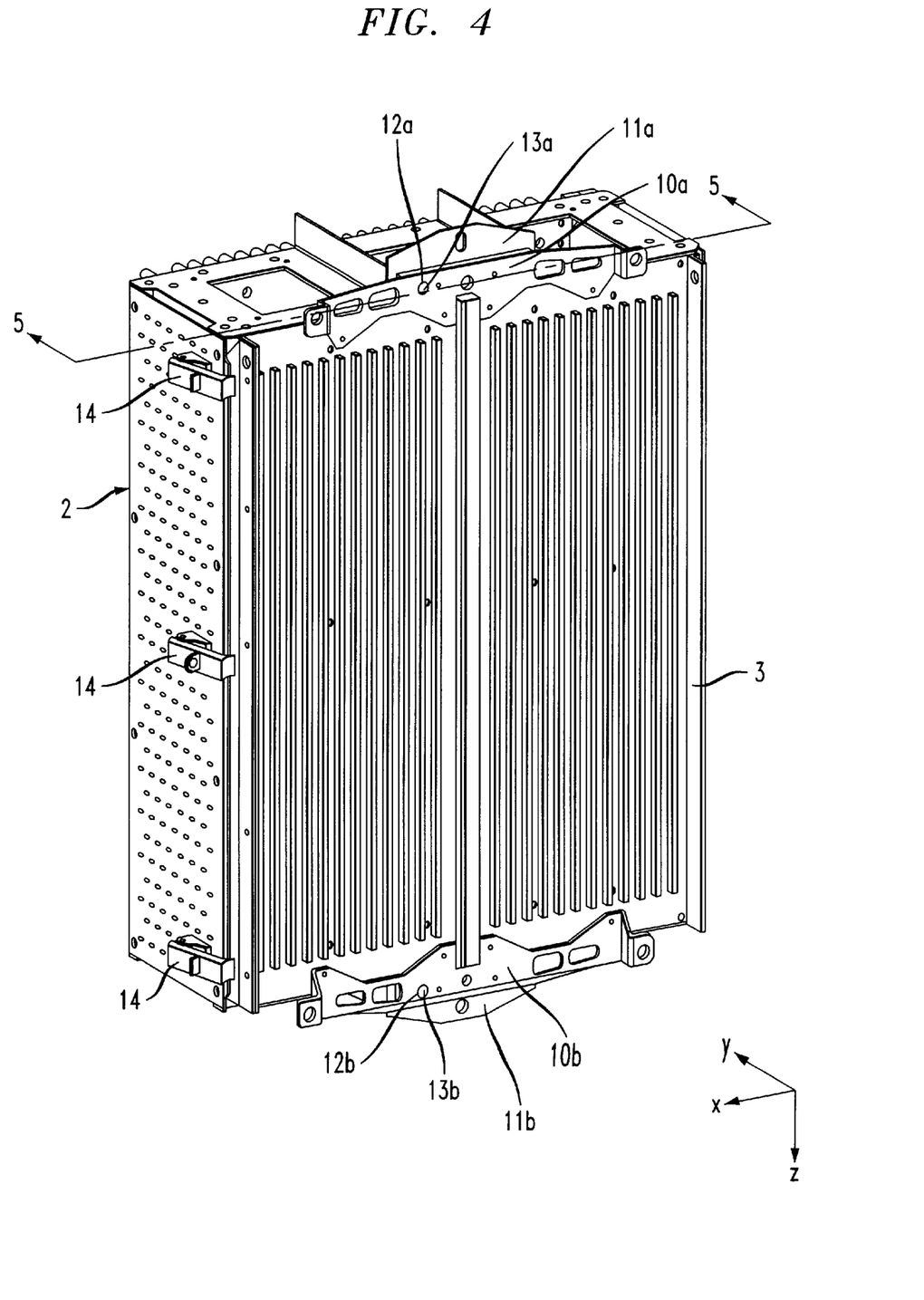
FIG. 4 is a perspective view of the cover and side of the container shown in FIG. 1 with the cover in a closed position.

In a single closing action, cover 3 contacts cabinet 2, as shown in FIG. 4. The closing action is typically done in a single action with a tension lock 14. The tension lock is preferably a cam like mechanism.

Figure 3:
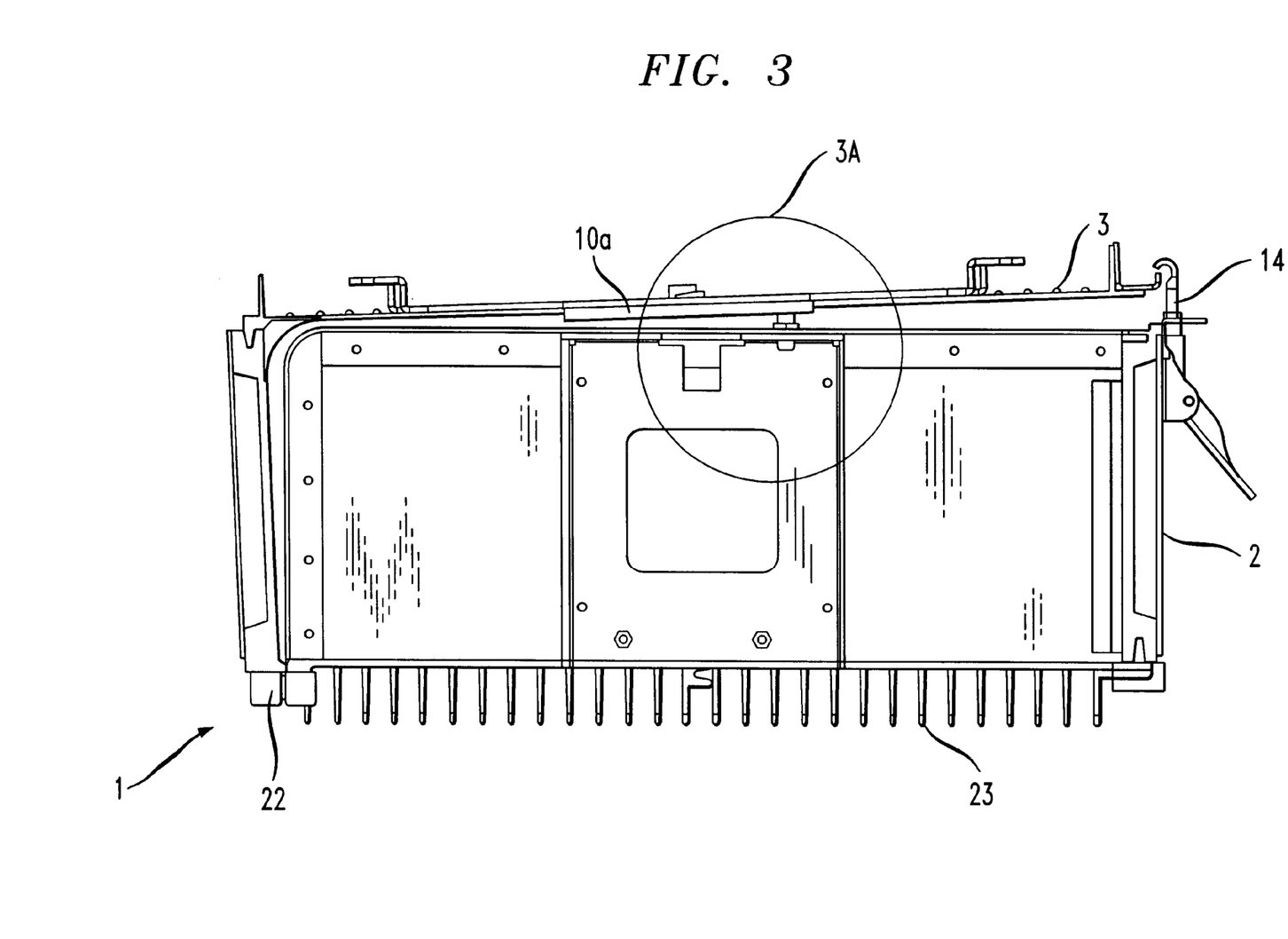
FIG. 3 is a top plan view of the container in FIG. 1 at point of mechanism engagement.
Figure 3A:
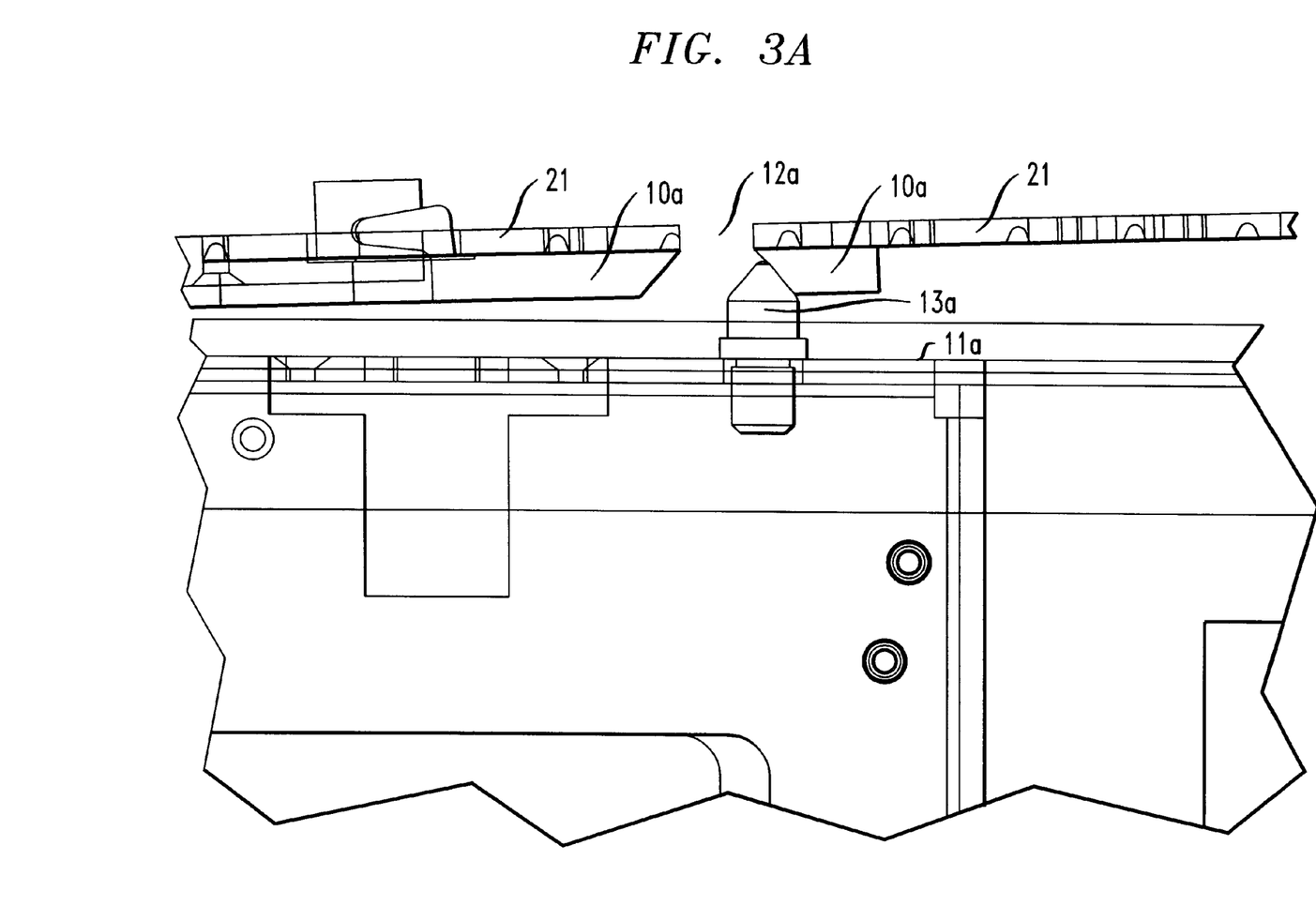
FIG. 3A is a magnified partial cross-sectional view of the phantom circle in FIG. 3.
Figure 3B:
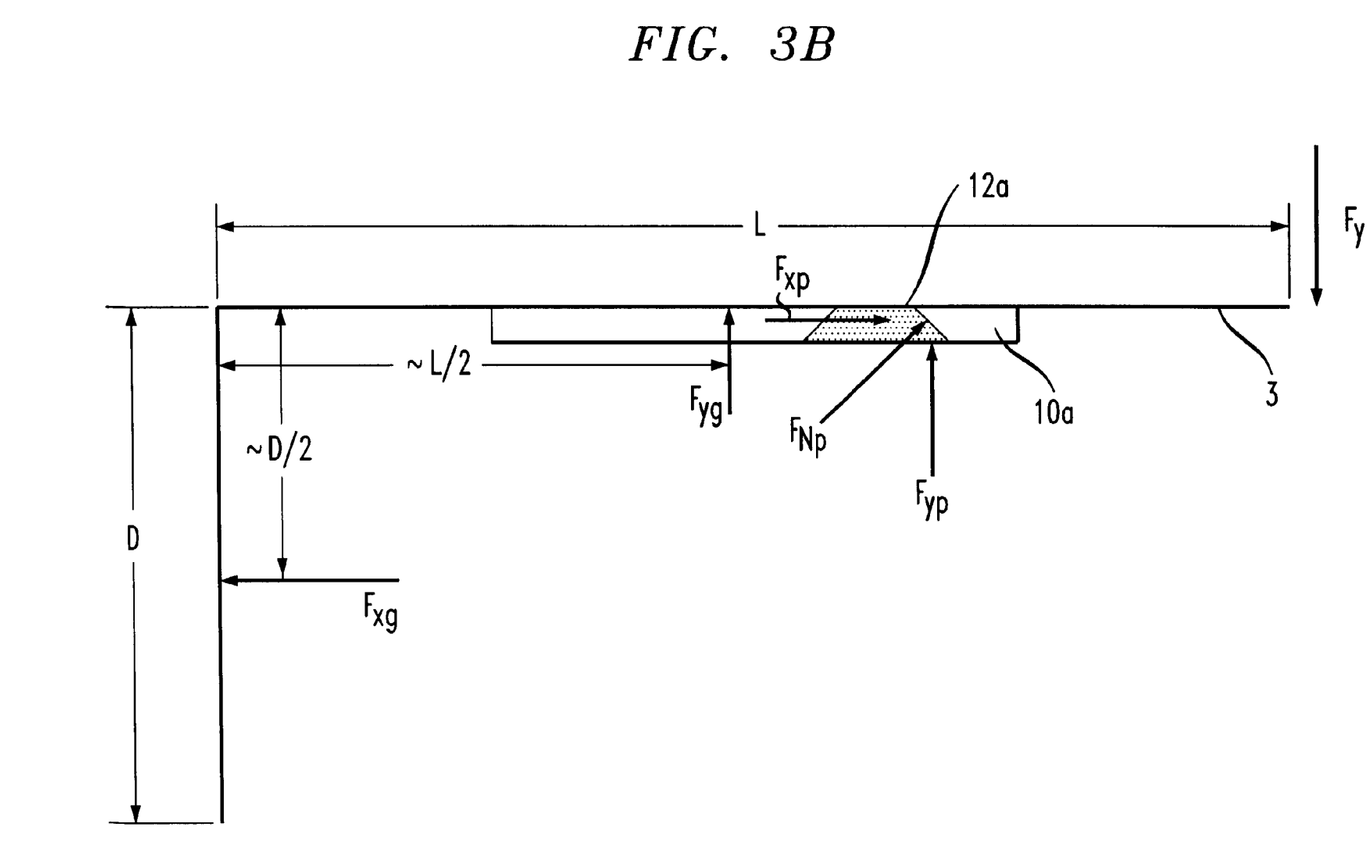
FIG. 3B is a free body diagram showing alignment forces on the container cover.

FIG. 3A is a magnified partial cross-sectional view of phantom circle A in FIG. 3. FIG. 3A illustrates the coaction of the alignment pin 13a and alignment plate 10a. FIG. 3B is a free body diagram which illustrates the forces involved between alignment pin 13a and alignment plate 10a during the closing action. In FIG. 3B, $F_y$ represents the forces generated by the tension lock 14. $F_{yg}$ represents the force of the gasket in the y-direction. $F_{Np}$ represents the normal force of the alignment pin. $F_{Np}$ is broken down into $F_{xp}$ and $F_{yp}$ based on the incline plane analogy familiar to one of ordinary skill in the art. $F_{xp}$ represents the alignment pin force in the x-direction. $F_{yp}$ represents the alignment pin force in the y-direction. $F_{yp}$ is equal to $F_{xg}$.

When $F_y$ is applied, $F_{yg}$, $F_{yp}$, $F_{xp}$ and $F_{xg}$ are overcome. The incline plane provides the mechanical advantage needed to sealingly engage the cover with the container body in the L and D planes as defined in FIG. 3A.

Figure 5:
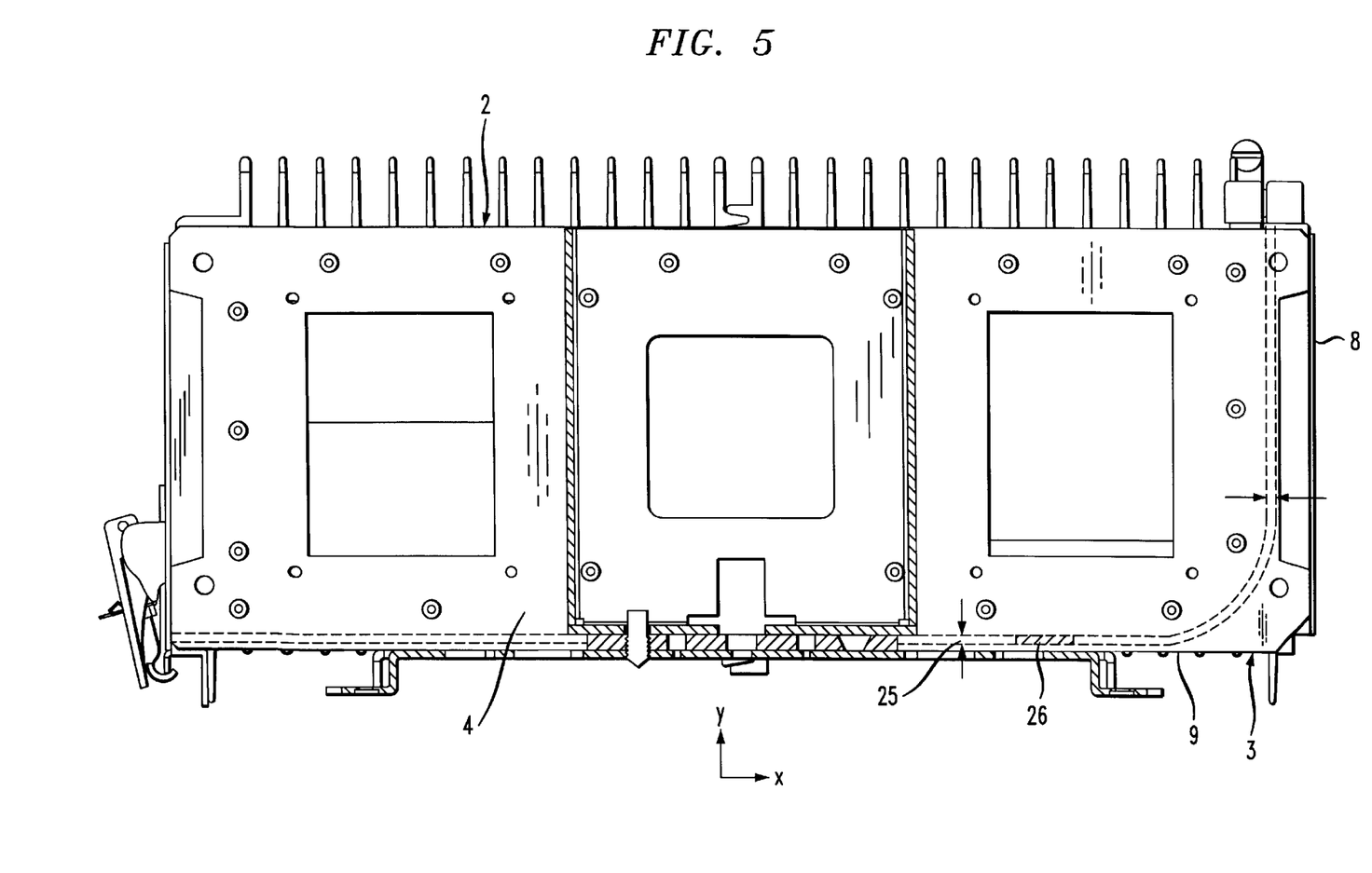
FIG. 5 is a top plan view of the container of FIG. 4 taken partly in section lines 5—5.

In a preferred embodiment, the tension lock 14 must overcome a force, $F_{xg}$, of 540 pounds in the x-direction and a force, $F_{yg}$, of 900 pounds in the y-direction. As can be understood from FIGS. 1–5, when alignment plates 10a and 10b are parallel to alignment brackets 11a and 11b, conical holes 12a and 12b engage alignment pins 13a and 13b to provide alignment of cover 3 with cabinet 2. Tension lock 14 engages cover 3 to provide a sealing force. When alignment pins 13a and 13b and conical holes 12a and 12b are engaged, there is a nominal gap 25, or space, between cover 3 and cabinet 2 for a gasket 26. Nominal Gap 25 is illustrated in FIG. 5. Nominal gap 25 is defined by panels 8 and 9 and the edge portions of top 4 and bottom 5 contacting cover 3. Alignment pins 13a and 13b provide a substantially uniform gap in the x-direction and in the curved section between 3a and 4c, while alignment plates 10a and 10b provide a substantially uniform gap in the y-direction, that in combination, form nominal gap 25. The gasket prevents water intrusion and electromagnetic interference seals between cover 3 and cabinet 2. The nominal gap 25 can be any required dimension based on the gasket used. In the preferred embodiment, the gasket is made of a conductive material, namely, a carbon-filled, urethane-based polymer, and the nominal gap 25 is about 0.135 inches. In addition, the alignment pins 13a and 13b and plates 10a and 10b combination provide the necessary force to overcome gasket compression of about 15 pounds/inch and friction forces between pins 13a and 13b and plates 10a and 10b, and the angle between the alignment pins 13a and 13b and plates 10a and 10b provides a nominal angle of attack because of a hinge swing radius that is not tangent. The tension lock/alignment pin/alignment plate assembly keeps the cover from moving in the z-x direction, as shown in FIG. 4.

The container of the present invention provides a single action closing of the container by using a right angled cover and a latch/alignment pin/alignment plate system to compress, align and seal the enclosures simultaneously in two perpendicular directions. The interaction between the pin and the plate provides the necessary force to overcome gasket compression and friction forces between the pin and plate as discussed above. The mechanical system also provides initiating closing forces to close the cover and keep the gasket compressed during service life.

While this invention has been described in conjunction with specific embodiments thereof, it is evident that many alternatives, modifications, and variations will be apparent to those skilled in the art. Accordingly, the preferred embodiments of the invention set forth herein are intended to be illustrative, not limiting. Various changes may be made without departing from the spirit and scope of the invention as defined in the appended claims. For example, although the shapes of conical holes 12a and 12b and alignment pins 13a and 13b are most preferably both conical, other shapes may be employed. What is important is that there be corresponding tapered surfaces that engage each other to guide the edge portions of the container and cover into proper alignment for achieving the desired sealing action.

What is claimed is:

1. A sealable container comprising:
   a container body having a top, a bottom, a back wall, and a side wall;
   a cover movably connected to said back wall and capable of communicating with at least portions of said top, said bottom, said side wall, and said back wall;
   at least one alignment piece, having a substantially tapered alignment hole, connected to said cover;
   at least one corresponding alignment bracket, having an alignment pin having a tapered distal tip portion capable of engaging said tapered alignment hole, connected to said container body; and
   at least one tension lock connected to said container body and adapted to engage said cover when said cover is in a closed position and apply sealing force between an edge portion of said cover and edge portions of said container body.

2. The sealable container of claim 1 wherein said alignment hole and said alignment pin coact to align and sealingly engage said cover and said container body.

3. The sealable container of claim 1 further comprising a compressible gasket positioned in a gap between said cover and said container body when said cover is in said closed position.

4. The sealable container of claim 3 wherein said gap is about 0.135 inches.

5. The sealable container of claim 3 wherein said gasket is comprised of electrically conductive material and water sealing material.

6. The sealable container of claim 5 wherein said conductive material is a carbon-filled, urethane-based polymer.

7. The sealable container of claim 1 further comprising a shield mounting bracket on said cover.

8. The sealable container of claim 1 wherein said cover is a door.

9. The sealable container of claim 1 wherein said container body is a cabinet.

10. The sealable container of claim 1 further comprising a hinge connecting said cover to said back wall.

11. The sealable container of claim 1 wherein said tension lock comprises a plurality of under center draw latches located on said side wall placed at a distance from an edge portion of said side wall.

12. The sealable container of claim 1 wherein said alignment piece is substantially parallel to a portion of said cover.

13. The sealable container of claim 1 wherein said alignment bracket is substantially parallel to said back wall.

14. The sealable container of claim 1 wherein said alignment pin extends substantially perpendicularly outwardly from said alignment bracket.

15. The sealable container of claim 1 wherein said alignment bracket and said alignment piece are substantially parallel when said cover is in said closed position.

16. The sealable container of claim 1 wherein said cover substantially forms a right angle.

17. A sealable base station comprising:
   a cabinet having a top a bottom, a back wall, and a side wall;
   a door connected to said back wall and capable of communicating with at least portions of said top, bottom, and said side wall, said door substantially forming a right angle;
   a hinge connecting said door to said back wall;
   a plurality of under center draw latches located on said side wall placed at a distance from an edge portion of said side wall, said latches adapted to engage said door when said door is in a closed position and applying sealing force between edge portions of said door and edge portions of said cabinet;
   at least one alignment piece, having a substantially conical hole and being substantially parallel to a panel of said door, connected to said door; and
   at least one corresponding alignment bracket, having a substantially conical alignment pin capable of engaging said conical hole and being substantially parallel to said back wall connected to said cabinet, said alignment pin extending substantially perpendicularly outwardly from said bracket.

18. The sealable container of claim 17, wherein said conical hole and said alignment pin coact to align and sealingly engage said door and said cabinet.

* * * * *